(12) United States Patent
Kojima

(10) Patent No.: US 12,609,694 B2
(45) Date of Patent: Apr. 21, 2026

(54) BIAS CIRCUIT, POWER ON RESET CIRCUIT, AND MONITORING SYSTEM

(71) Applicant: MITSUBISHI ELECTRIC CORPORATION, Tokyo (JP)

(72) Inventor: Tomokazu Kojima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 59 days.

(21) Appl. No.: 18/847,550

(22) PCT Filed: Mar. 29, 2022

(86) PCT No.: PCT/JP2022/015606
§ 371 (c)(1),
(2) Date: Sep. 16, 2024

(87) PCT Pub. No.: WO2023/188023
PCT Pub. Date: Oct. 5, 2023

(65) Prior Publication Data
US 2025/0211224 A1      Jun. 26, 2025

(51) Int. Cl.
*H03K 17/22*          (2006.01)
(52) U.S. Cl.
CPC ................................... *H03K 17/22* (2013.01)
(58) Field of Classification Search
CPC .................................................... H03K 17/22
USPC ................ 327/142, 143, 530, 538, 542, 543
See application file for complete search history.

(56) References Cited

U.S. PATENT DOCUMENTS

| | | | | |
|---|---|---|---|---|
| 2004/0004518 A1* | 1/2004 | Moriwaki | ............... | H03F 1/302 |
| | | | | 330/296 |
| 2004/0251967 A1* | 12/2004 | Moriwaki | ............... | H03F 1/302 |
| | | | | 330/296 |
| 2014/0070890 A1* | 3/2014 | Iyomasa | ................... | H03F 3/21 |
| | | | | 330/296 |
| 2015/0137877 A1* | 5/2015 | Choi | ....................... | G05F 3/205 |
| | | | | 327/537 |
| 2016/0079927 A1* | 3/2016 | Kamitani | .................. | H03F 3/21 |
| | | | | 330/296 |

(Continued)

FOREIGN PATENT DOCUMENTS

| | | |
|---|---|---|
| JP | 2016048518 A | 4/2016 |
| WO | 2016063957 A1 | 4/2016 |

OTHER PUBLICATIONS

Gray et al., "Analysis and Design of Analog Integrated Circuits", Fourth Edition, John Wiley & Sons, Inc., Apr. 2001, p. 425. (4 pages).

(Continued)

*Primary Examiner* — William Hernandez
(74) *Attorney, Agent, or Firm* — Buchanan Ingersoll & Rooney PC

(57)          ABSTRACT
A bias circuit includes a first resistive device connected between a power supply node to supply a supply voltage and a first node, a first N-type transistor diode-connected between the first node and a ground, a second N-type transistor, a second resistive device connected between a second node and a third node, and a third N-type transistor connected between the third node and the ground to implement a current source. The second N-type transistor has a drain connected to the power supply node, a source connected to the second node to output a bias voltage, and a gate connected to the first node.

15 Claims, 9 Drawing Sheets

(56) References Cited

U.S. PATENT DOCUMENTS

| | | | |
|---|---|---|---|
| 2017/0099033 A1* | 4/2017 | Shimamune | H03F 3/191 |
| 2017/0163223 A1* | 6/2017 | Shimamoto | H03F 1/56 |
| 2024/0429880 A1* | 12/2024 | Honda | H03F 3/26 |

OTHER PUBLICATIONS

International Search Report (PCT/ISA/210) with translation and Written Opinion (PCT/ISA/237) mailed on Jul. 5, 2022, by the Japan Patent Office as the International Searching Authority for International Application No. PCT/JP2022/015606. (8 pages).

Wang et al., "Sub-threshold Design for Ultra Low-Power Systems", Springer, Dec. 2006, p. 157. (4 pages).

* cited by examiner

BIAS CIRCUIT, POWER ON RESET CIRCUIT, AND MONITORING SYSTEM

TECHNICAL FIELD

The present disclosure relates to a bias circuit, as well as a power on reset circuit and a monitoring system including the same.

BACKGROUND ART

Tendency toward "decarbonization" to reduce an amount of emission of greenhouse gas such as carbon dioxide ($CO_2$) to substantially zero has accelerated worldwide. Among others, at a great turning point, with expectation of low power consumption and power saving, a batteryless technology without the use of batteries or an energy harvesting technology to generate electric power from natural energy for elongation of battery lifetime has attracted attention.

At the same time, demand for a technology of a wireless sensor network combined with a technology for watching without manpower, a security technology, and an Internet of Things (IoT) technology, with the use of a supply voltage generated according to the energy harvesting technology, has increased more than before. In order to realize such a system, the technology to generate electric power from natural energy is important.

Since a stable supply voltage is supplied in equipment including a general battery or a general power supply plug, a rise characteristic of the supply voltage is also substantially constant. Therefore, though abrupt variation in supply voltage is taken into consideration to some extent, a circuit and a system are designed basically on the premise that the supply voltage is stable and substantially constant.

Therefore, as described in WO2016/063597 (PTL 1), a band gap reference circuit for highly accurate supply of a constant reference voltage with respect to process variation or variation in temperature is basically implemented by a feedback circuit on the premise that it operates within a voltage range where a transistor operates in a saturated region, although certain voltage variation is taken into consideration.

PTL 1 describes generation of a reference voltage and generation of a comparative voltage in accordance with a supply voltage from a control voltage which is a voltage at a node slower in rise of the voltage than the reference voltage, and output of a power on reset signal based on comparison between the comparative voltage and the reference voltage.

CITATION LIST

Patent Literature

PTL 1: WO2016/063597

Non Patent Literature

NPL 1: Sub-threshold Design for Ultra Low-Power Systems, Alice Wang, Springer, 2006, Page, 157

SUMMARY OF INVENTION

Technical Problem

A circuit configuration in PTL 1 is useful in that the reference voltage can highly accurately be generated by construction of a feedback circuit when the supply voltage at a certain level or higher can reliably be obtained and a time period for boot-up of the supply voltage can be expected in advance.

In the energy harvesting technology described above, on the other hand, electric power is generated from natural energy. Therefore, an output voltage from an energy harvesting power supply such as a solar cell or an oscillating device steeply varies; for example, increase in voltage approximately from 0 [V] to 1.5 [V] occurs on the order of 10 [ns]. With respect to an unstable supply voltage which causes such steep variation in voltage, it is difficult for a reference voltage generation circuit (band gap reference circuit) described in PTL 1 to operate in a stable manner at a high speed.

A feedback circuit can generate a highly accurate voltage by feedback of an output voltage to an input circuit. In contrast, a time period for stabilization of a loop by the time of stabilization of a feedback system should be provided, and hence it is difficult to generate a sufficiently stable voltage or signal by the time of lapse of the time period for stabilization.

Therefore, there is a concern about difficulty in generation of a constant reference voltage at appropriate timing when variation in supply voltage is steep and the supply voltage rises before lapse of the time period for stabilization of the loop as a result of application of the energy harvesting technology.

The present disclosure was made to solve such a problem, and an object of the present disclosure is to provide a configuration of a bias circuit to generate a constant bias voltage highly accurately and quickly at the time of boot-up of a supply voltage that steeply increases.

Solution to Problem

According to one aspect of the present invention, a bias circuit is provided. The bias circuit includes at least one bias circuit unit including a first resistive device, a first N-type transistor, a second N-type transistor, a second resistive device, and a third N-type transistor. The first resistive device is connected between a power supply node to supply a supply voltage and a first node. The first N-type transistor is diode-connected between the first node and a ground. The second N-type transistor has a drain connected to the power supply node, a source connected to a second node to output a bias voltage, and a gate connected to the first node. The second resistive device is connected between the second node and a third node. The third N-type transistor is connected between the third node and the ground to implement a current source.

Advantageous Effects of Invention

According to the present disclosure, when voltages at the first node and the third node become higher than threshold voltages of the first N-type transistor and the third N-type transistor at the time of boot-up of the supply voltage, respectively, a bias voltage and a bias current not directly dependent on the supply voltage can be generated at the second node. Therefore, at the time of boot-up of the supply voltage that steeply increases, with a feedforward configuration, a constant bias voltage can be generated highly accurately and quickly.

BRIEF DESCRIPTION OF DRAWINGS

FIG. 7 is a conceptual waveform diagram illustrating an operation of the power on reset circuit according to the second embodiment.

DESCRIPTION OF EMBODIMENTS

Figure 1:
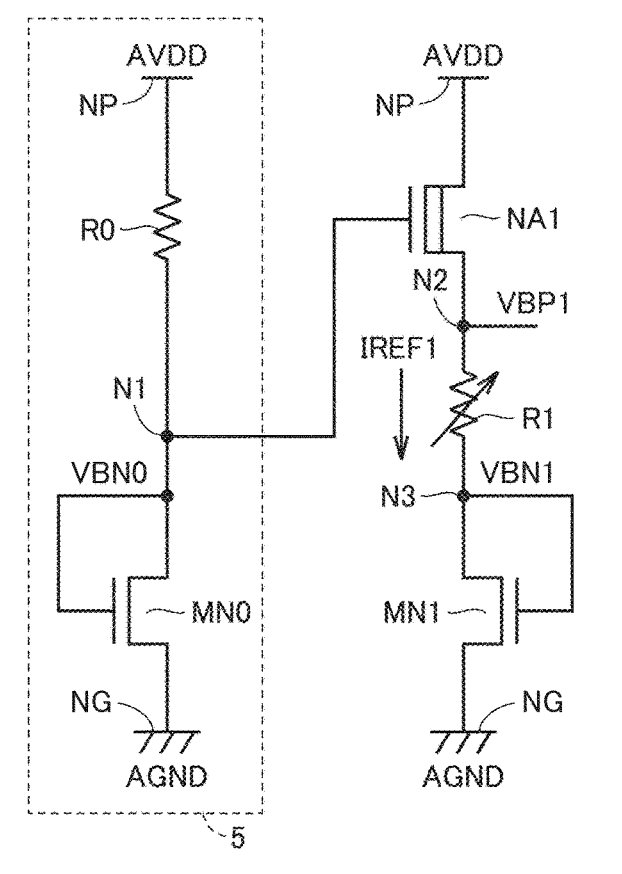
FIG. 1 is a circuit diagram illustrating a configuration of a bias circuit according to a first embodiment.

An embodiment of the present disclosure will be described in detail below with reference to the drawings. The same or corresponding elements in the drawings below have the same reference characters allotted and description thereof will not be repeated in principle.

First Embodiment

FIG. 1 is a circuit diagram illustrating a configuration of a bias circuit 10a according to a first embodiment. The bias circuit according to the present embodiment generates a predetermined constant voltage as a bias voltage. The bias voltage is used, for example, for an operation of another circuit in the same system or generation of a power on reset signal as in PTL 1.

As shown in FIG. 1, bias circuit 10a includes a voltage generator 5, an N-type transistor NA1, a resistive device R1, and an N-type transistor MN1 to implement a current source. Voltage generator 5 includes a resistive device R0 and a diode-connected N-type transistor MN0.

As will be described below, the bias circuit according to the present embodiment is configured to include at least one bias circuit unit, with bias circuit 10a shown in FIG. 1 being defined as a basic unit (which will be referred to as a "bias circuit unit" below). Bias circuit 10a according to the first embodiment includes a single bias circuit unit as a most basic configuration.

In voltage generator 5, resistive device R0 is connected between a power supply node NP to supply a supply voltage AVDD and a node N1. N-type transistor MN0 is connected between node N1 and a ground node NG corresponding to a "ground". N-type transistor MN0 has a gate connected to node N1. In other words, N-type transistor MN0 has a source grounded and diode-connected.

N-type transistor NA1 has a drain connected to power supply node NP, a source connected to a node N2, and a gate connected to node N1 of voltage generator 5. N-type transistor NA1 is implemented, for example, by a native transistor having a threshold voltage of 0 [V].

Resistive device R1 is connected between node N2 and a node N3. Resistive device R1 is preferably configured such that an electrical resistance value thereof is adjustable by trimming or the like. Electrical resistance values of resistive devices R0 and R1 are also denoted as R0 and R1 below, respectively.

N-type transistor MN1 has a drain connected to node N3 and a source connected to ground node NG. Furthermore, N-type transistor MN1 has a gate connected to node N3, and in the example in FIG. 1, N-type transistor MN1 has the source grounded, and it is diode-connected to operate as a current source.

When supply voltage AVDD rises from 0 [V] in voltage generator 5, a leakage current in N-type transistor MN0 increases a voltage VBN0 at node N1. When voltage VBN0 becomes higher than a threshold voltage VTHMN0 (for example, around 0.8 [V]) of N-type transistor MN0, N-type transistor MN0 starts to operate in a saturated region or a weak inversion region. Voltage VBN0 at node N1 connected to a drain of N-type transistor MN0 attains approximately to the threshold voltage (for example, 0.8 [V]) of N-type transistor MN1. Even when supply voltage AVDD further increases thereafter, an amount of voltage lowering in resistive device R0 increases, whereas increase in voltage VBN0 at node N1 is suppressed.

When voltage VBN0 (node N1) that increases with increase in supply voltage AVDD and a gate-source voltage VGSNA1 of N-type transistor NA1 are used in bias circuit 10a, relation with a bias voltage VBP1 which is a source voltage of N-type transistor NA1 (native transistor) is expressed in an expression (1) below.

$$VBP1 = VBN0 - VGSNA1 \tag{1}$$

In an example where N-type transistor NA1 is implemented by the native transistor, gate-source voltage VGSNA1 is substantially 0 [V] and hence VBP1 can be VBP1=VBN0.

Figure 2:
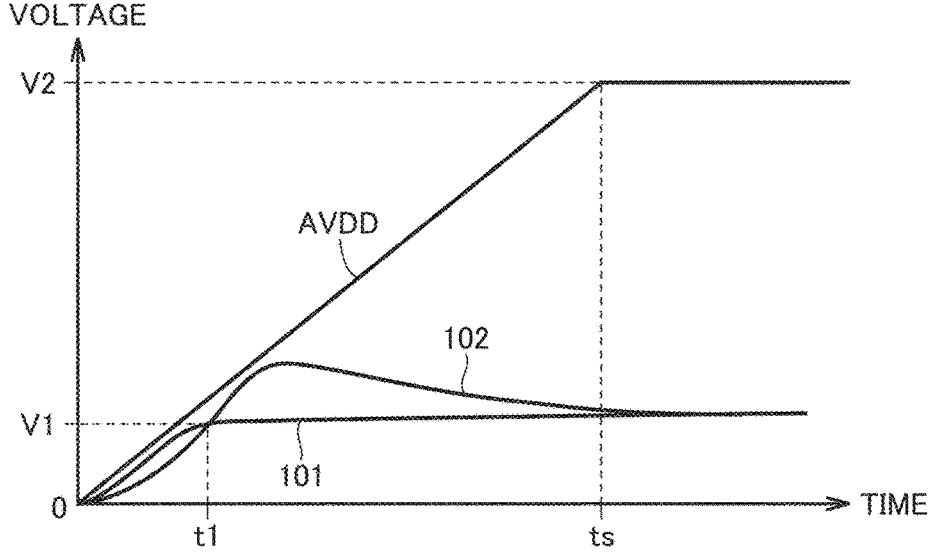
FIG. 2 is a conceptual waveform diagram illustrating an operation of the bias circuit shown in FIG. 1.

FIG. 2 is a conceptual waveform diagram illustrating an operation of bias circuit 10a shown in FIG. 1.

FIG. 2 shows with a reference 101, an exemplary waveform of bias voltage VBP1 outputted from bias circuit 10a when supply voltage AVDD at power supply node NP increases at a constant rate from 0 to V2 (for example, around several volts [V]). An exemplary waveform of a bias voltage generated by a feedback type voltage generation circuit as in PTL 1 is shown with a reference 102 as a comparative example.

As shown with reference 102, in the feedback circuit, the bias voltage which is the output voltage is fed back to the input circuit, and hence the bias voltage can highly accurately be maintained. In contrast, a time period for stabilization until the feedback system is stabilized should be provided, and it is difficult to generate a sufficiently stable bias voltage by the time of lapse of the time period for stabilization of a loop. For example, with a phase compensation capacitance of an operational amplifier being denoted as C, for a bias current IBIAS, the time period for stabilization of (C/IBIAS) is required at minimum.

Therefore, the bias voltage generated by the feedback circuit is not settled at a steady constant voltage V1 until time ts at which the time period for stabilization elapses. On the other hand, at time ts or later, as a result of feedback control, the bias voltage can be expected to highly accurately become constant at V1.

As shown with reference 101 in FIG. 2, on the other hand, bias voltage VBP1 from bias circuit 10a varies with increase in supply voltage AVDD without configuring a feedback system. Specifically, at time t1, the bias voltage increases to voltage V1 determined by characteristics of N-type transistors MN0 and MN1, at time t1 or later, the bias voltage is maintained in the vicinity of V1 even when supply voltage AVDD further increases.

Thus, with a feedforward configuration, bias circuit 10a can generate bias voltage VBP1 dependent on supply voltage AVDD. With the configuration with a feedforward circuit, a phase compensator arranged in a feedback circuit is not necessary, and bias voltage VBP1 can quickly be converged even with respect to fast boot-up of the supply voltage.

A lowest operating voltage of bias circuit 10a corresponds to a threshold voltage of N-type transistor MN0 or MN1. Therefore, for example, when supply voltage AVDD increases approximately to 0.8 [V], bias circuit 10a can generate bias voltage VBP1.

In bias circuit 10a, a bias current IREF1 that flows through node N2 and resistive device R1 can be expressed with voltage VBN1 at node N3, in an expression (2) below. VBN1 corresponds to a gate-source voltage VGSMN1 of N-type transistor MN1.

$$IREF1 = (VBP1 - VBN1)/R1 \qquad (2)$$

In an example where N-type transistor NA1 is the native transistor, VBP1 is VBP1=VBN0 as described above, and hence the expression (2) can be transformed into an expression (3). In other words, bias current IREF1 can be generated not to directly be dependent on supply voltage AVDD.

$$IREF1 = (VBN0 - VBN1)/R1 \qquad (3)$$

As described in NPL 1, voltage VBN0 at node N1 in voltage generator 5 has such dependency on supply voltage AVDD as varying by the (½) power (that is, V (AVDD)) or a natural logarithm ln(AVDD). Therefore, at time t1 or later in FIG. 2, bias voltage VBP1 varies on the order of √(AVDD) or ln(AVDD) with variation in supply voltage AVDD. Therefore, it is understood that variation in bias voltage VBP1 with variation in supply voltage AVDD in a steady state after turn-on of the power supply can be suppressed without the configuration of the feedback circuit.

As described above, bias circuit 10a according to the first embodiment can promptly start operating when supply voltage AVDD increases approximately to the threshold voltages of N-type transistors MN0 and MN1, and can maintain bias voltage VBP1 substantially constant even with respect to abrupt variation in supply voltage AVDD. In particular, since phase compensation in the feedback circuit is not necessary owing to the feedforward configuration, bias voltage VBP1 can quickly converge at the time of turn-on of the power supply as shown with reference 101 in FIG. 1.

Bias current IREF1 can finely be adjusted with the use of resistive device R1 based on the expression (3). Therefore, by configuring resistive device R1 with a variable resistive device by trimming or the like, bias voltage VBP1 can finely be adjusted in correspondence with variation in manufacturing of N-type transistors MN0, MN1, and NA1 (native transistor).

Node N1, node N2, and node N3 in FIG. 1 correspond to the "first node," the "second node," and the "third node," respectively, and resistive devices R0 and R1 correspond to one example of the "first resistive device" and one example of the "second resistive device," respectively. Furthermore, N-type transistor MN0 corresponds to one example of the "first N-type transistor," N-type transistor NA1 corresponds to one example of the "second N-type transistor," and N-type transistor MN1 corresponds to one example of the "third N-type transistor," respectively.

First Modification of First Embodiment

In a first modification of the first embodiment, an exemplary configuration in which bias circuit units (bias circuits 10a in FIG. 1) are connected in a plurality of stages in a multiplex manner will be described.

Figure 3:
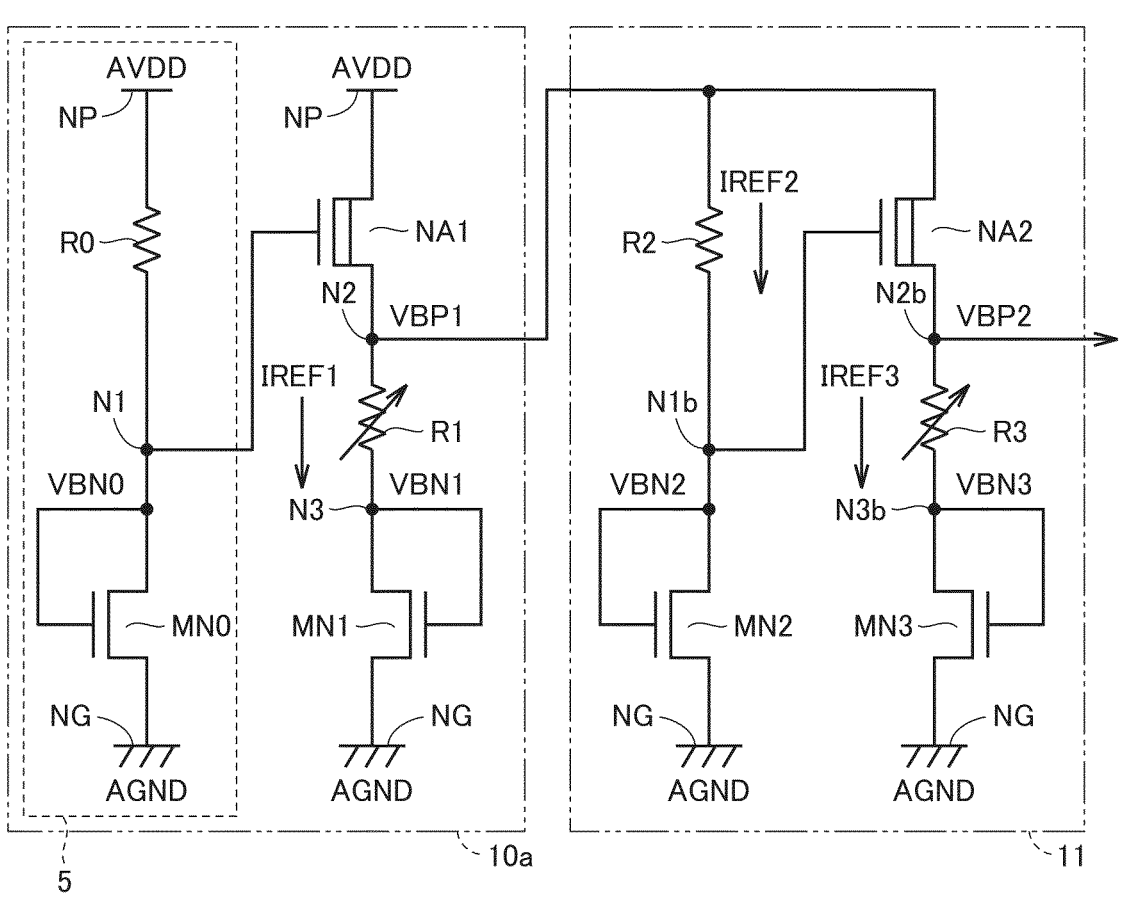
FIG. 3 is a circuit diagram illustrating a configuration of a bias circuit according to a first modification of the first embodiment.

FIG. 3 is a circuit diagram illustrating a configuration of a bias circuit 10b according to the first modification of the first embodiment.

Referring to FIG. 3, bias circuit 10b further includes a bias circuit unit 11 in a stage subsequent to bias circuit 10a according to the first embodiment. The configuration of bias circuit 10a is the same as in FIG. 1, and bias circuit 10a generates bias voltage VBP1 at node N2.

Bias circuit unit 11 includes resistive devices R2 and R3 and N-type transistors MN2, MN3, and NA2 (native transistor) corresponding to resistive devices R0 and R1 and N-type transistors MN0, MN1, and NA1 (native transistor) in bias circuit 10a, respectively.

Resistive device R2 is connected between node N2 and a node N1b, and N-type transistor MN2 has a drain connected to node N1b and a source connected to ground node NG. N-type transistor MN2 is diode-connected, with a gate being connected to the drain (node N1b).

N-type transistor NA2 (native transistor) has a drain connected to node N2, a source connected to a node N2b, and a gate connected to node N1b. Resistive device R3 is connected between node N2b and a node N3b. N-type transistor MN3 has a drain connected to node N3b and a source connected to ground node NG. N-type transistor MN3 has a gate connected to the drain (node N3b). In other words, N-type transistors MN2 and MN3 are each diode-connected, similarly to N-type transistors MN0 and MN1 in bias circuit 10a.

Thus, resistive devices R2 and R3 and N-type transistors MN2, MN3, and NA2 of bias circuit unit 11 are connected between node N2 to which bias voltage VBP1 is outputted from bias circuit 10a and ground node NG, in arrangement relation similar to that of resistive devices R0 and R1 and N-type transistors MN0, MN1, and NA1 in bias circuit 10a. In other words, it is understood that bias circuit 10b is configured such that the bias circuit units corresponding to bias circuits 10a are connected in two stages.

Therefore, bias circuit unit 11 operates in such a configuration that supply voltage AVDD in bias circuit 10a is replaced with bias voltage VBP1 from bias circuit 10a. Bias circuit 10b according to the first modification of the first embodiment outputs a bias voltage VBP2 from node N2b of bias circuit unit 11. A bias current IREF2 flows through node N1b, and a bias current IREF3 is generated at node N2b similarly to bias current IREF1.

As described in the first embodiment, voltage VBP1 at node N2 varies with variation in supply voltage AVDD on the order of √(AVDD) or ln(VDD). Furthermore, in bias circuit unit 11, voltage VBP2 at node N2b or voltage VBP1 at node N2 varies with variation in voltage VBP1 on the order of $\sqrt{\text{(VBP1)}}$ or $\ln(\text{VBP1})$. Consequently, it is understood that bias voltage VBP2 outputted from bias circuit 10*b* varies with variation in supply voltage AVDD on the order of $\sqrt{(\sqrt{\text{(AVDD)}})}$ or $\ln(\ln(\text{AVDD}))$.

Therefore, according to bias circuit 10*b* according to the first modification of the first embodiment, variation in bias voltage VBP2 with variation in supply voltage AVDD at time t1 or later in FIG. 2, that is, in a steady state after turn-on of the power supply, can be suppressed as compared with that in the first embodiment. Thus, quick convergence at the time of turn-on of the power supply owing to adoption of the feedforward circuit can be achieved, and variation in bias voltage VBP2 with abrupt variation in supply voltage AVDD can be suppressed without the use of the feedback circuit.

Though an exemplary configuration in which the bias circuit units corresponding to bias circuits 10*a* are connected in two stages is described with reference to FIG. 3, such a configuration that the bias circuit units are connected in at least three stages in a multiplex manner can also be applicable. In this case, in the bias circuit unit in the second stage or a subsequent stage, node N2 of the bias circuit unit in the previous stage is sequentially defined as power supply node NP, and resistive device R0 and the drain of N-type transistor NA1 (FIG. 1) are connected thereto. As there are a larger number of stages, variation in bias voltage with variation in supply voltage AVDD is suppressed, whereas a circuit scale increases.

Second Modification of First Embodiment

An effect of suppression of variation in bias voltage with variation in supply voltage AVDD is described in the first embodiment and the first modification thereof. In a second modification of the first embodiment, a circuit configuration for suppression of variation in bias voltage also with variation in temperature in addition to variation in supply voltage AVDD will be described.

Figure 4:
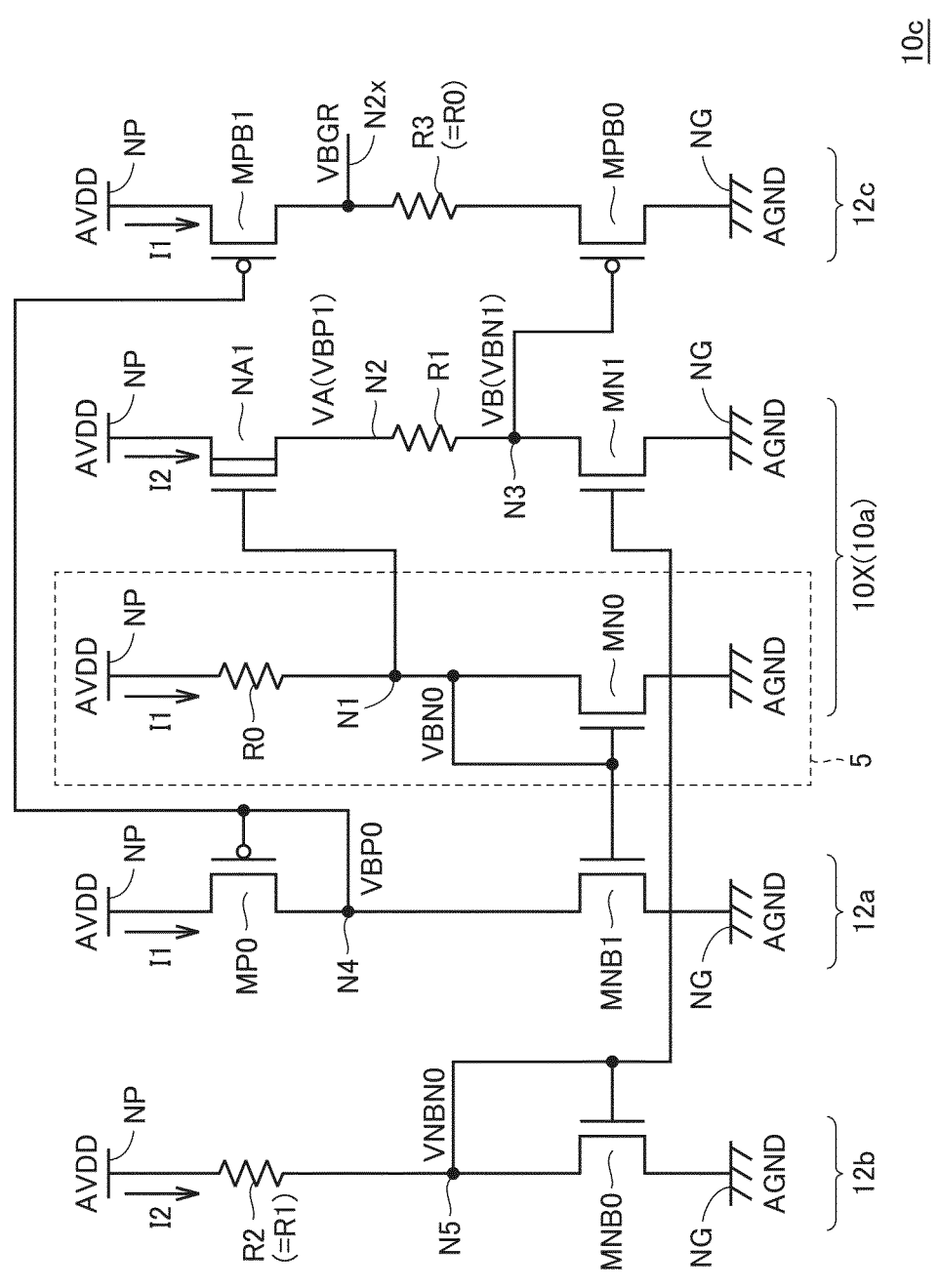
FIG. 4 is a circuit diagram illustrating a configuration of a bias circuit according to a second modification of the first embodiment.

FIG. 4 is a circuit diagram illustrating a configuration of a bias circuit 10*c* according to the second modification of the first embodiment.

Referring to FIG. 4, bias circuit 10*c* includes a bias circuit unit 10X, series circuits 12*a* and 12*b* to copy a current, and an output stage 12*c* to output a constant voltage (bias voltage).

Bias circuit unit 10X is configured similarly to bias circuit 10*a* according to the first embodiment, and includes resistive devices R0 and R1 and N-type transistors MN0, MN1, and NA1 (native transistor). As in FIG. 1, N-type transistor MN0 is diode-connected, with the gate being connected to node N1, and N-type transistor NA1 has the gate connected to node N1. The gate of N-type transistor MN1 to implement the current source, on the other hand, is connected to a gate of an N-type transistor MNB0 in series circuit 12*b* which will be described later, rather than node N3. In FIG. 4, the voltage at node N1 is denoted as VBN0 as in FIG. 1, whereas the voltage at node N2 is denoted as VA (VBP1 in FIG. 1) and the voltage at node N3 is denoted as VB (VBN1 in FIG. 1). A current that flows through resistive device R0, node N1, and N-type transistor MN0 is denoted as I1 and a current that flows through N-type transistors NA1 and MN1 and nodes N2 and N3 is denoted as I2.

Series circuit 12*a* has a P-type transistor MP0 and N-type transistor MNB1 between power supply node NP and ground node NG, P-type transistor MP0 and N-type transistor MNB1 being connected in series with a node N4 being interposed. P-type transistor MP0 is diode-connected, with a gate being connected to node N4. N-type transistor MNB1 has a gate connected in common to N-type transistor MN0 of bias circuit unit 10X. Since N-type transistors MNB1 and MN0 implement a current mirror, current I1 flows from power supply node NP to ground node NG in series circuit 12*a*. A voltage at node N4 in series circuit 12*a* is denoted as VBP0 below.

Series circuit 12*b* has resistive device R2 and N-type transistor MNB0 between power supply node NP and ground node NG, resistive device R2 and N-type transistor MNB0 being connected in series with a node N5 being interposed. Resistive device R2 is equivalent in electrical resistance value to resistive device R1 in bias circuit unit 10X. N-type transistor MNB0 is diode-connected, with the gate being connected to node N5. Furthermore, N-type transistor MNB0 has the gate connected in common to N-type transistor MN1 of bias circuit unit 10X. Since N-type transistors MNB0 and MN1 thus implement the current mirror, current I2 flows from power supply node NP to ground node NG in series circuit 12*b*. A voltage at node N5 in series circuit 12*b* is denoted as VNBN0 below.

Output stage 12*c* has P-type transistors MPB1 and MPB0 and resistive device R3 connected in series between power supply node NP and ground node NG. P-type transistor MPB1 is connected between power supply node NP and a node N2*x*. P-type transistor MPB0 has a drain connected to ground node NG. Resistive device R3 is connected between node N2*x* and a source of P-type transistor MPB0. Resistive device R3 is equivalent in electrical resistance value to resistive device R0 in bias circuit unit 10X. Bias circuit 10*c* generates a constant voltage (bias voltage) VBGR at node N2*x*.

P-type transistor MPB1 has a gate connected to a gate of P-type transistor MP0 in series circuit 12*a*. Since P-type transistors MPB1 and MP0 thus implement the current mirror, current I1 flows from power supply node NP to node N2*x* in output stage 12*c*. P-type transistor MPB0 has a gate connected to node N3 (a drain of N-type transistor MN1) of bias circuit unit 10X.

Circuit operations of bias circuit 10*c* will now be described in detail. Current I1 in voltage generator 5 is expressed with a gate-source voltage VGSMN0 (VBN0=VGSMN0) of N-type transistor MN0 and an electrical resistance value (R0) of resistive device R0, in an expression (4) below.

$$I1 = (AVDD - VGSMN0)/R0 \tag{4}$$

Current I2 in series circuit 12*b* is expressed with a gate-source voltage VGSMNB0 (VNBN0=VGSMNB0) of N-type transistor MNB0 and an electrical resistance value (R1) of resistive device R2, in an expression (5) below.

$$I2 = (AVDD - VGSMNB0)/R1 \tag{5}$$

In bias circuit unit 10X, voltage VA at node N2 can be expressed with an electrical resistance value (R0) of resistive device R0 in an expression (6) below, with a threshold voltage of N-type transistor NA1 implemented by the native transistor being defined as 0 [V]. Similarly, voltage VB at node N3 can be expressed in an expression (7).

$$VA = AVDD - I1 \times R0 \qquad (6)$$

$$VB = VA - I2 \times R1 \qquad (7)$$

The expression (4) to the expression (7) can be summarized to express voltage VB in an expression (8).

$$VB = VGSMNB0 - I1 \times R0 \qquad (8)$$

Bias voltage VBGR generated at node N2$x$ in output stage 12$c$ is expressed with a gate-source voltage VGSMPB0 of P-type transistor MPB0 and the electrical resistance value (R0) of resistive device R3, in an expression (9) below.

$$VBGR = VB + VGSMPB0 + I1 \times R0 \qquad (9)$$

Based on the expression (8) and the expression (9), bias voltage VBGR can be expressed in an expression (10) below.

$$VBGR = VGSMNB0 + VGSMPB0 \qquad (10)$$

On the assumption that N-type transistor MNB0 (having threshold voltage VTHMNB0) and P-type transistor MPB0 (having threshold voltage VTHMPB0) are operating in a subthreshold region, the expression (10) can be transformed into an expression (11), where n represents a subthreshold coefficient, VT represents a thermal voltage, and K(K=W/L) represents a ratio between a gate width W and a gate length L of P-type transistor MPB0 and N-type transistor MNB0. Thermal voltage VT is shown as VT=k•T/q where k represents a Boltzmann constant, T [K] represents a temperature, and q represents an elementary charge.

$$VBGR = VTHMNB0 + VTHMPB0 + \eta \cdot VT \cdot \ln(K) \qquad (11)$$

In the expression (11), the term (VTHMNB0+VTHMPB0) has been known to vary at a negative temperature coefficient (CTAT: Complementary To Absolute Temperature) with an ambient temperature (T). In other words, conditions of δVTHMNB0/δT<0 and δVTHMPB0/δT<0 are satisfied.

In contrast, the term η•VT•In(K) in the expression (11) varies at a positive temperature coefficient (PTAT: Proportional To Absolute Temperature) with the ambient temperature (T). Namely, a condition of δ(η•VT•In(K))/δT>0 is satisfied. Therefore, by adjusting a circuit constant or representatively a size ratio K of the transistor, variation in bias voltage VBGR with variation in ambient temperature can be 0, that is, δVBGR/δT=0.

Thus, according to bias circuit 10$c$ according to the second modification of the first embodiment, by further arranging series circuits 12$a$ and 12$b$ and output stage 12$c$, in addition to the effect of the bias circuit according to the first embodiment, variation in bias voltage with variation in ambient temperature can be suppressed. Variation in bias voltage of bias circuit 10$c$ with variation in supply voltage AVDD is equivalent to that in bias circuit 10$a$ according to the first embodiment.

In FIG. 4, series circuits 12$a$ and 12$b$ correspond to one example of the "first series circuit" and one example of the "second series circuit," respectively, and resistive devices R2 and R3 correspond to one example of the "third resistive device" and one example of the "fourth resistive device," respectively. Furthermore, N-type transistor MNB1 corresponds to one example of the "fourth N-type transistor," N-type transistor MNB0 corresponds to one example of the "fifth N-type transistor," P-type transistor MP0 corresponds to one example of the "first P-type transistor," P-type transistor MPB1 corresponds to one example of the "second P-type transistor," and P-type transistor MPB0 corresponds to one example of the "third P-type transistor," respectively.

Third Modification of First Embodiment

In a third modification of the first embodiment, a bias circuit capable of further obtaining a constant voltage with low impedance by further combination of an amplification circuit will be described.

Figure 5:
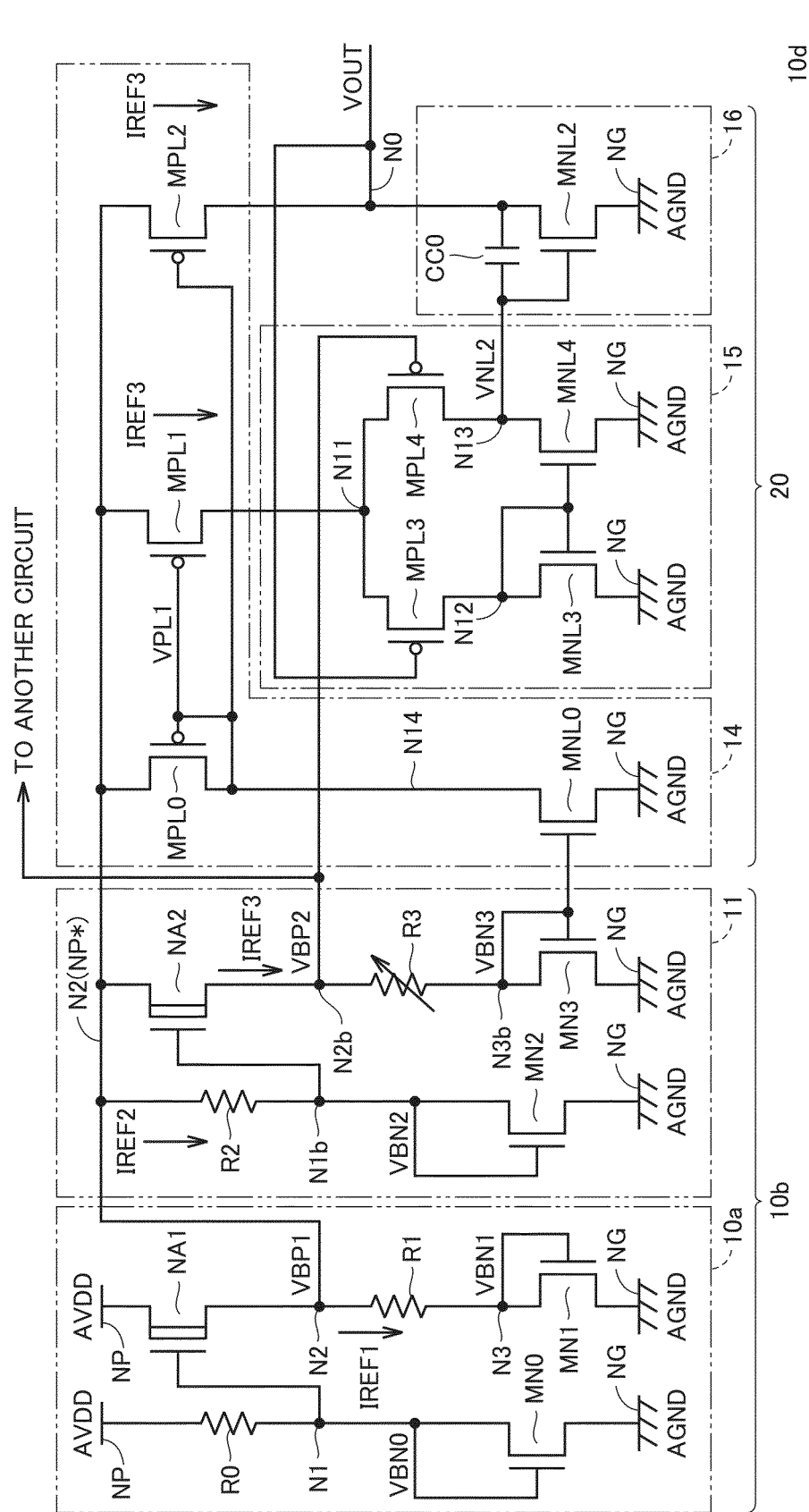
FIG. 5 is a circuit diagram illustrating a configuration of a bias circuit according to a third modification of the first embodiment.

FIG. 5 is a circuit diagram illustrating a configuration of the bias circuit according to the third modification of the first embodiment.

Referring to FIG. 5, a bias circuit 10$d$ according to the third modification of the first embodiment is configured such that an amplification circuit 20 including a current supply unit 14, a differential amplification unit 15, and a control unit 16 is connected in a stage subsequent to bias circuit 10$b$ according to the first modification of the first embodiment.

As described with reference to FIG. 3, bias circuit 10$b$ is configured such that bias circuits 10$a$ (bias circuit units) are connected in a plurality of stages (two stages here), and bias voltage VBP1 is generated at node N2 and bias voltage VBP2 is generated at node N2$b$. These bias voltages VBP1 and VBP2 can be outputted to another circuit outside bias circuit 10$b$ and used for operations of another circuit.

Differential amplification unit 15 has P-type transistors MPL 3 and MPL4 and N-type transistors MNL3 and MNL4. Differential amplification unit 15 operates, with node N2 where bias voltage VBP1 is outputted from bias circuit 10$a$ being defined as a power supply node NP*. In other words, differential amplification unit 15 operates by being supplied with the bias voltage and a bias current from bias circuit 10$b$.

Specifically, P-type transistors MPL 3 and MPL4 to form a differential pair are connected between a node N11 and a node 12 and between node N11 and a node N13, respectively. P-type transistor MPL1 has a gate connected to an output node NO of amplification circuit 20, and bias voltage VBP2 of bias circuit 10$b$ is inputted to a gate of P-type transistor MPL4.

N-type transistors MNL3 and MNL4 are connected between node N12 and ground node NG and between node N13 and ground node NG, respectively. N-type transistors MNL3 and MNL4 have respective gates connected to node N12.

Control unit 16 has a phase compensation capacitor CC0 and an N-type transistor MNL2. N-type transistor MNL2 has a drain connected to output node NO, a source connected to ground node NG, and a gate connected to node N13. Phase compensation capacitor CC0 is connected between node N13 (that is, the gate of N-type transistor MNL2) and output node NO.

Current supply unit 14 has an N-type transistor MNLO and P-type transistors MPL0 to MPL2. N-type transistor MN0 is connected between a node N14 and ground node NG, and has a gate connected to node N3b (bias circuit 10b). P-type transistor MPL0 is connected between power supply node NP* (node N2) and node N14.

P-type transistor MPL1 is connected between power supply node NP* and node N11 of differential amplification unit 15. P-type transistor MPL2 is connected between power supply node NP* and output node NO. P-type transistors MPL0 to MPL2 have their gates connected to node N14 in common.

Since N-type transistor MNLO together with N-type transistor MN3 of bias circuit 10b implement the current mirror in current supply unit 14, a current in proportion to a constant bias current IREF3 generated at node N2b in bias circuit 10b flows through node N14. Since description will be given here with a current mirror ratio being defined as 1:1, bias current IREF3 equivalent to that at node N2b is produced at node N14.

Furthermore, since P-type transistors MPL0 to MPL2 implement the current mirror (the current mirror ratio being defined again as 1:1), bias current IREF3 is supplied also to node N11 (that is, differential amplification unit 15) and output node NO.

Therefore, differential amplification unit 15 performs a differential amplification operation, with bias current IREF3 supplied through P-type transistor MPL1 being defined as a tail current, N-type transistors MNL3 and MNL4 implementing the current mirror being defined as active loads, and P-type transistors MPL 3 and MPL4 being defined as the differential pair. Differential amplification unit 15 thus outputs to node N13, a gate voltage difference between P-type transistors MPL1 and MPL4, that is, a voltage obtained by amplification of the voltage difference between bias voltage VBP2 and a voltage (VOUT) at output node NO.

Control unit 16 controls N-type transistor MNL2 to have the current in accordance with the voltage at node N13, that is, the output from differential amplification unit 15, flow out of output node NO supplied with bias current IREF3 by P-type transistor MPL2 to ground node NG. Control unit 16 thus operates in an attempt to maintain the voltage at output node NO at bias voltage VBP2. Consequently, stable output voltage VOUT with low impedance obtained by amplification of bias voltage VBP2 generated by bias circuit 10b is generated at output node NO. Output voltage VOUT can be supplied to another block, another system, or any circuit outside a chip. In the configuration in FIG. 5, N-type transistor MNL2 corresponds to one example of the "sixth N-type transistor."

Bias circuit 10d according to the third modification of the first embodiment can further output to the outside, output voltage VOUT with low impedance obtained by amplification of bias voltage VPB2, in addition to stable bias voltages VBP1 and VBP2 described in the first embodiment and the first modification thereof.

At this time, amplification circuit 20 uses as the supply voltage, bias voltage VPB2 of bias circuit 10b which is stable with respect to quick boot-up of and variation in supply voltage AVDD. Therefore, variation also in output voltage VOUT with quick boot-up of and variation in supply voltage AVDD can be suppressed.

In addition, since a current in proportion to bias current IREF3 of bias circuit 10b which is not directly linked to variation in supply voltage AVDD is used also for an operating current of amplification circuit 20, differential amplification unit 15 can operate in a very stable manner.

Furthermore, by setting a bias voltage lower and more stable than supply voltage AVDD as the supply voltage, a withstand voltage of the transistor implementing differential amplification unit 15 can be lowered. By employing the transistor with low withstand voltage, further higher accuracy of output voltage VOUT can be achieved.

The configuration in FIG. 5 can also be such that amplification circuit 20 is connected in a stage subsequent to bias circuit 10a or 10c instead of bias circuit 10b, or in a stage subsequent to a bias circuit where bias circuit units (10a) are connected in at least three stages.

Second Embodiment

In a second embodiment, a power on reset (POR) circuit including the bias circuit described in the first embodiment will be described.

Figure 6:
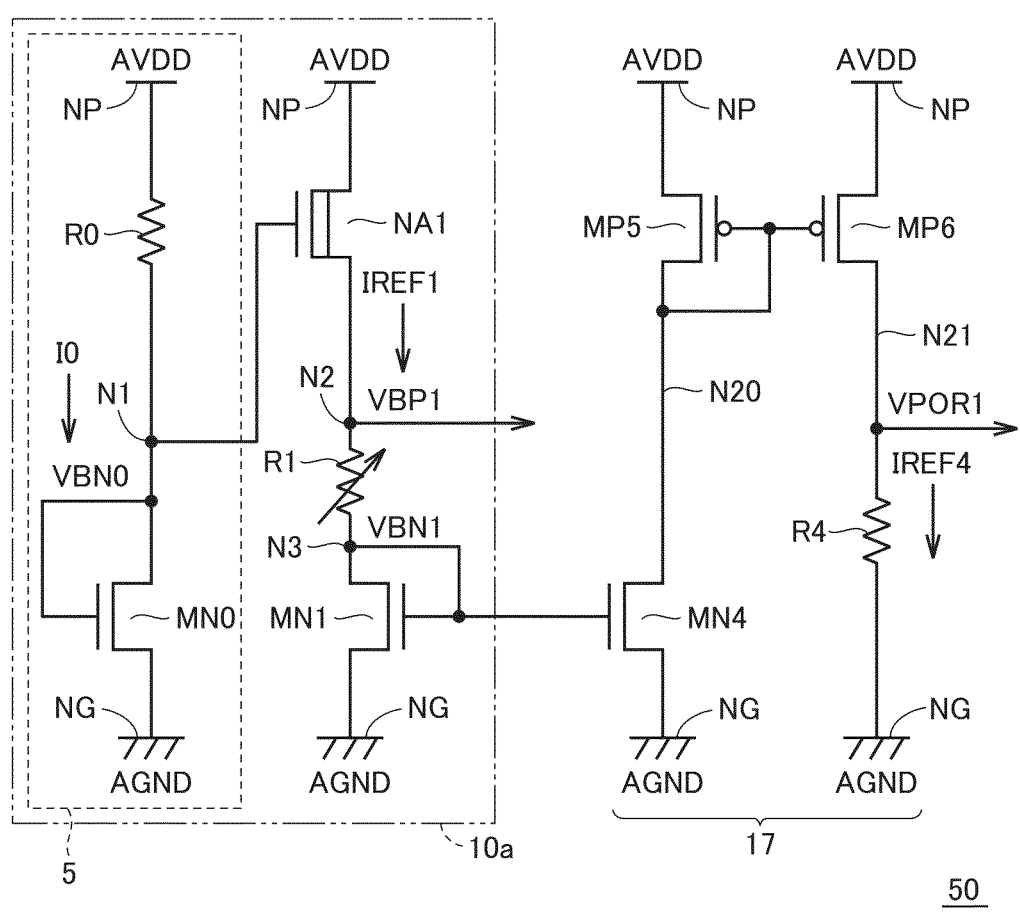
FIG. 6 is a circuit diagram illustrating a configuration of a power on reset circuit according to a second embodiment.

FIG. 6 is a circuit diagram showing an exemplary configuration of the power on reset circuit according to the second embodiment.

Referring to FIG. 6, a power on reset circuit 50 according to the second embodiment includes bias circuit 10a according to the first embodiment and a signal generator 17. The configuration and the operation of bias circuit 10a are the same as those in the first embodiment, and bias voltage VBP1 is generated at node N2. Signal generator 17 generates at a node N21, a signal VPOR1 varying in logical level in transition from a state where supply voltage AVDD is lower than a predetermined voltage to a state where supply voltage AVDD is higher than the predetermined voltage. In other words, the logical level of signal VPOR1 varies in response to rise of supply voltage AVDD.

Signal generator 17 has P-type transistors MP5 and MP6, an N-type transistor MN4, and a resistive device R4. P-type transistor MP5 is connected between power supply node NP and a node N20, and N-type transistor MN4 is connected between node N20 and ground node NG. P-type transistor MP6 is connected between power supply node NP and a node N21, and resistive device R4 is connected between node N21 and ground node NG.

P-type transistors MP5 and MP6 have respective gates connected to node N20 to implement the current mirror. N-type transistor MN4 has a gate connected to node N3 to implement the current mirror with N-type transistor MN1 in bias circuit 10a.

A circuit operation of power on reset circuit 50 will now be described.

With a current I0 that flows through N-type transistor MN0 of bias circuit 10a, a circuit equation in an expression (12) below is established. Since current I0 corresponds to a drain current of N-type transistor MN0, an expression (13) below is also established. β in the expression (13) represents a gain coefficient of the transistor, and β is expressed as $\beta = \mu \cdot Cox \cdot (W/L)$ where $\mu$ represents an average surface mobility, Cox represents a gate capacitance per unit area, and (W/L) represents a ratio between a gate width and a gate length.

$$I0 = (AVDD - VGSMN0)/R0 \tag{12}$$

$$I0 = (1/2) \cdot \beta \cdot (VGSMN0 - VTHMN0)^2 \tag{13}$$

Since it is understood based on the expressions (12) and (13) above that VGSMN0 is in proportion to V (AVDD), by using a constant K, VGSMN0 can be shown as $VGSMN0 = K \cdot \sqrt{(AVDD)}$.

For bias current IREF1 that flows through node N2, a circuit equation in an expression (14) below is established.

$$IREF1 = (VGSMN0 - VGSMN1)/R1 \quad (14)$$

As described above, N-type transistors MN1 and MN4 implement the current mirror and P-type transistors MP5 and MP6 implement the current mirror. With the current mirror ratios of both of them being defined as 1:1, voltage VPOR1 generated at node N21 is shown with an electrical resistance value (R4) of resistive device R4 in the expression (14). In other words, it is understood that VP0R1 is set in accordance with an amount of voltage lowering caused in resistive device R4 by a current IREF4 in proportion to bias current IREF1.

$$VPOR1 = IREF1 \times R4 \quad (15)$$

An expression (16) can be obtained from the expression (14) and the expression (15).

$$VPOR1 = (VGSMN0 - VGSMN1) \times (R4/R1) \quad (16)$$

On the assumption that VGSMN0 is expressed in the expression (16) as VGSMN0=K·√(AVDD) and K is set to K=1, when VGSMN1 is set to VGSMN1=0.5 [V] and a condition of (R4/R1)=2 is satisfied, the expression (16) is transformed into an expression (17)

$$VPOR1 = 2 \cdot (\sqrt{(AVDD)} - 0.5) \quad (17)$$

Based on the expression (17), when a condition of √(AVDD)–0.5<0 is satisfied, that is, when AVDD is lower than approximately 0.7 [V], VPOR1 is set to a ground voltage AGND (0 [V]) (that is, a logic low level is output­ted). In contrast, when a condition of √(AVDD)–0.5>0 is satisfied, that is, when AVDD is higher than approximately 0.7 [V], VPOR 1 is set to VPOR1=AVDD (that is, a logic high level is outputted).

On the other hand, a lowest operating supply voltage VOPmin1 at which power on reset circuit 50 shown in FIG. 6 can operate is the sum of gate-source voltage VGSNA1 of N-type transistor NA1 (native transistor), voltage lowering (IREF1×R1) caused in resistive device R1, and gate-source voltage VGSMN1 of N-type transistor MN1. In other words, as supply voltage AVDD becomes higher than VOPmin1= (VGSNA1+IREF1×R1+VGSMN1), the circuit operation can be performed. This is because N-type transistors MN0 and MN4 and P-type transistors MP5 and MP6 can operate also in a region where a condition of AVDD<VOPmin1 is satisfied.

For example, with the gate-source voltage (VGSNA1) of the native transistor being set to (VGSNA1)=0.1 [V], IREF1×R1=0.1 [V], and the gate-source voltage (VGSMN1) of an enhancement transistor being set to (VGSMN1)=0.6 [V], the sum of them is calculated as VOPmin1=0.8 [V].

For the operation of power on reset circuit 50, supply voltage AVDD should satisfy both of the condition of V (AVDD)–0.5>0 in the expression (16) and the condition of AVDD>VOPmin1.

Figure 7:
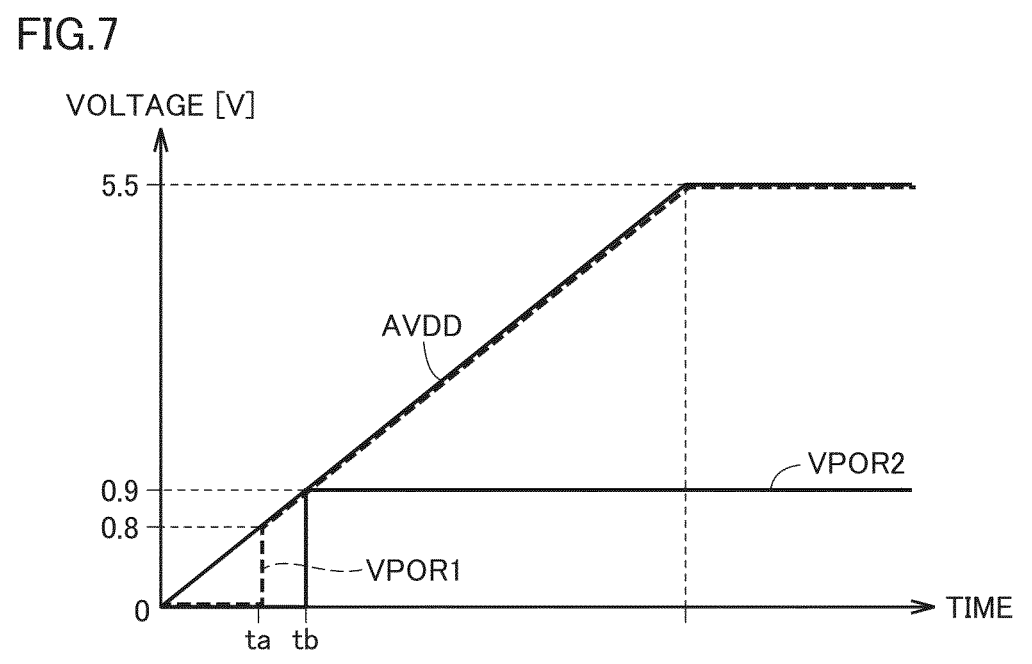

FIG. 7 shows with a dotted line, a conceptual waveform diagram showing transition of VPOR1 in response to rise of supply voltage AVDD, for illustrating an operation of power on reset circuit 50.

As described above, VPOR1 is set to the logic high level (VPOR1=AVDD) in the region where supply voltage AVDD satisfies both of the condition of √(AVDD)–0.5>0 and the condition of AVDD>VOPmin1, that is, the region where the condition of AVDD>0.8 [V] is satisfied in the example above.

In the region where the condition of AVDD<0.8 [V] is satisfied, on the other hand, VPOR1 is set to the logic low level (VPOR1=AGND=0 [V]).

Therefore, when supply voltage AVDD rises from 0 [V] to 5.5 [V], VPOR1 is set to the low level (0 [V]) until time ta when supply voltage AVDD reaches 0.8 [V], whereas VPOR1 is set to the high level (AVDD) at time ta or later.

Thus, according to the power on reset circuit according to the second embodiment, a power on reset signal (VPOR1) varying in logical level in correspondence with boot-up of supply voltage AVDD can be generated from output from bias circuit 10a in the feedforward configuration. In particular, as signal generator 17 uses the current in proportion to bias current IREF1 maintained in a stable manner with respect to variation in supply voltage AVDD, the power on reset signal can reliably be generated also with respect to abrupt variation in supply voltage AVDD.

In signal generator 17 in FIG. 6, node N20 corresponds the "fourth node," and node N21 corresponds to the "fifth node." P-type transistors MP5 and MP6 correspond to one example of the "fourth P-type transistor" and one example of the "fifth P-type transistor," respectively, and N-type transistor MN4 corresponds to the "seventh N-type transistor." VPOR1 corresponds to one example of the "control signal."

Modification of Second Embodiment

Figure 8:
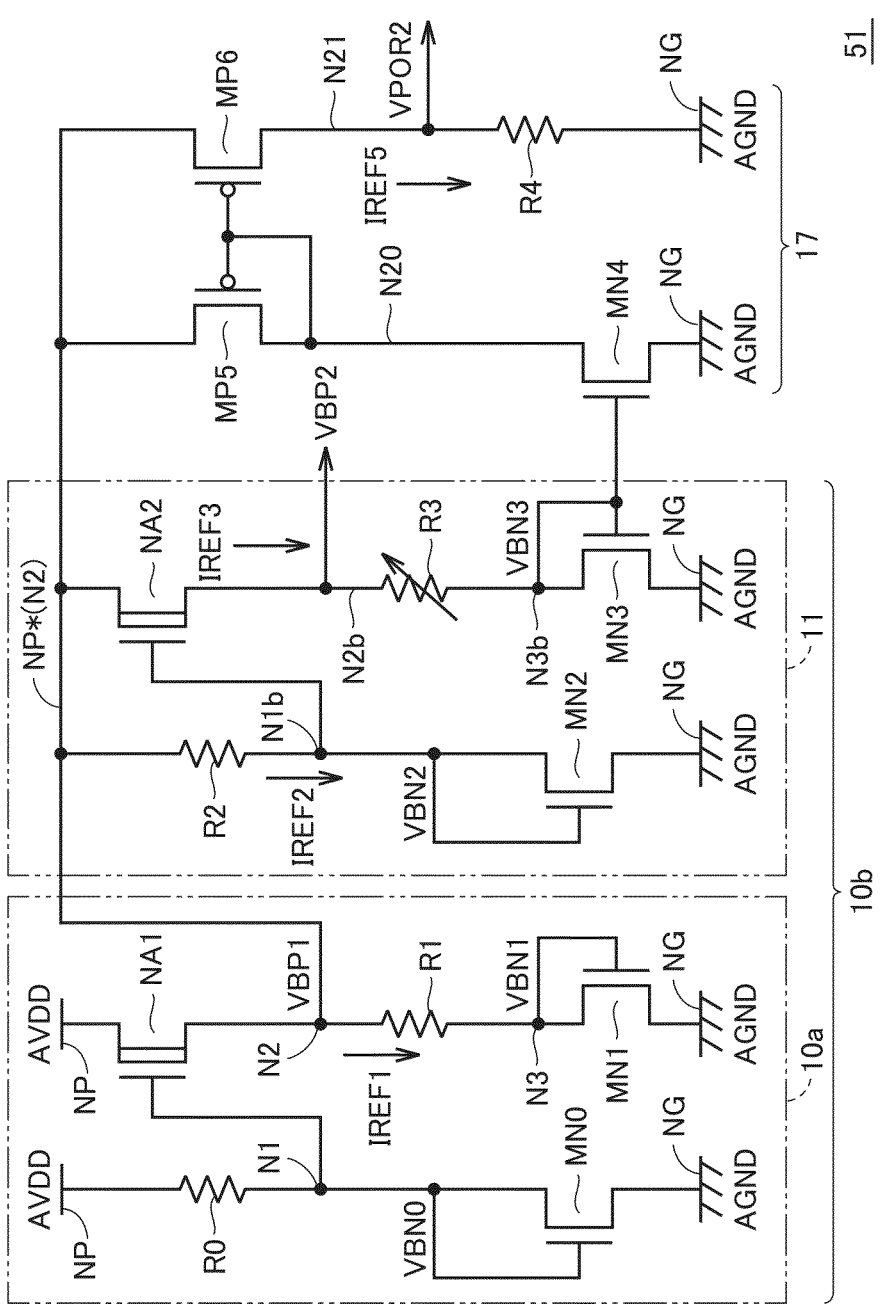
FIG. 8 is a circuit diagram illustrating a configuration of a power on reset circuit according to a modification of the second embodiment.

FIG. 8 is a circuit diagram showing an exemplary configuration of a power on reset circuit according to a modification of the second embodiment.

Referring to FIG. 8, a power on reset circuit 51 according to the modification of the second embodiment includes bias circuit 10b according to the second embodiment and signal generator 17 as in FIG. 6. The configuration and the operation of bias circuit 10b are the same as those in the first modification of the first embodiment, and bias voltage VBP1 is generated at node N2 and bias voltage VBP2 is generated at node N2b.

Signal generator 17 generates at node N21, a signal VPOR2 varying in logical level in response to rise of supply voltage AVDD, with node N2 being defined as power supply node NP*. Specifically, signal generator 17 shown in FIG. 8 is different from signal generator 17 shown in FIG. 6 in that P-type transistors MP5 and MP6 have their sources connected to power supply node NP* corresponding to node N2, instead of power supply node NP. Since signal generator 17 in FIG. 8 is otherwise similar in configuration to that in FIG. 6, detailed description will not be repeated.

In the configuration in FIG. 8, an operation to generate bias voltages VBP1 and VBP2 is recursively repeated. Therefore, a gate-source voltage VGSMN2 of N-type transistor MN2 can be expressed as VGSMN0=K·(AVDD)$^{1/4}$ by formulating with bias current IREF2 at node N1b and signal VPOR2 at node N21, an expression similar to the expressions (12) to (13) described above. Furthermore, similarly to the expression (17), an expression (18) below can be obtained for VPOR2. Specifically, it is understood that VPOR2 is set in accordance with an amount of voltage lowering caused in resistive device R4 by a current IREF5 in proportion to bias current IREF2.

$$VPOR2 = 2 \cdot \left((AVDD)^{1/4} - 0.5\right) \qquad (18)$$

Therefore, when a condition of $(AVDD)^{1/4} - 0.5 < 0$ is satisfied, that is, when AVDD is lower than $(0.5)^{1/4} \sim 0.84$ [V], VPOR2 is set to ground voltage AGND(0 [V]) (that is, the logic low level is outputted). In contrast, when a condition of $(AVDD)^{1/4} - 0.5 > 0$ is satisfied, that is, when AVDD is higher than approximately 0.84 [V], VPOR2 is set to VPOR2=VBP2 (that is, the logic high level is outputted).

A lowest operating supply voltage VOPmin2 at which power on reset circuit 51 shown in FIG. 8 can operate is the sum of gate-source voltages VGSNA1 and VGSNA2 of N-type transistors NA1 and NA2 (native transistors), voltage lowering (IREF3×R3) caused in resistive device R3, and a gate-source voltage VGSMN3 of N-type transistor MN3. In other words, as supply voltage AVDD becomes higher than VOPmin2=(VGSNA1+VGSNA2+IREF3×R3+VGSMN3), the circuit operation can be performed.

As described above, with the gate-source voltages of the native transistors being set to (VGSNA1, VGSNA2)=0.1 [V], IREF3×R3=0.1 [V], and the gate-source voltage of an enhancement transistor being set to (VGSMN3)=0.6 [V], the sum thereof, that is, VOPmin2, is set to VOPmin2=0.9 [V].

Therefore, for the operation of power on reset circuit 51, supply voltage AVDD should satisfy both of the conditions of $(AVDD)^{1/4} - 0.5 > 0$ in the expression (17) and AVDD>VOPmin2.

Referring again to FIG. 7, the conceptual waveform diagram showing transition of VPOR2 in response to rise of supply voltage AVDD for illustration of the operation of power on reset circuit 51 is shown with a solid line.

VPOR2 is set to the logic high level (VPOR2=VBP2=0.9 [V]) in the region where supply voltage AVDD satisfies both of the conditions of $(AVDD)^{1/4} - 0.5 > 0$ and AVDD>VOPmin2, that is, the region where the condition of AVDD>0.9 [V] is satisfied in the example above.

In the region where the condition of AVDD<0.9 [V] is satisfied, on the other hand, VPOR2 is set to the logic low level (VPOR2=AGND=0 [V]).

Therefore, when supply voltage AVDD rises from 0 [V] to 5.5 [V], VPOR2 is set to the low level (0 [V]) until time tb when supply voltage AVDD reaches 0.9 [V], whereas after time tb or later, VPOR2 is set to the high level (VBP2).

Thus, according to the power on reset circuit according to the modification of the second embodiment, in addition to the effect in the second embodiment, bias voltage VBP2, an amount of variation of which with variation in supply voltage AVDD is suppressed, can be used to generate the power on reset signal (POR2). Consequently, stability of the power on reset signal with respect to abrupt variation in supply voltage AVDD can further be improved.

Though the example in which N-type transistors NA1 and NA2 are implemented by the native transistors in the first and second embodiments and the modifications thereof is described, N-type transistors NA1 and NA2 can also be implemented by an enhancement type transistor. In this case, since the gate-source voltages of N-type transistors NA1 and NA2 are high, the level of supply voltage AVDD at which generation of the bias voltage can start increases. In other words, timing of stabilization of the bias voltage in FIG. 2 becomes later than time t1. Current drive power of N-type transistors NA1 and NA2, on the other hand, increases by employing the enhancement type transistor. Therefore, supply of the bias voltage accompanied by current consumption to some extent can be performed.

Third Embodiment

In a third embodiment, an exemplary configuration of a system to operate with a supply voltage generated according to the energy harvesting technology by using an output from the bias circuit described in the first embodiment and the modifications thereof or an output from the power on reset circuit described in the second embodiment and the modification thereof will be described.

A monitoring system to sense with a sensor or the like, occurrence of a possible abnormal state of a monitored target such as an assistance apparatus in the event of a disaster, a watching apparatus, a security apparatus, or a monitoring apparatus to monitor a power transmission line or the like has been used. Such a monitoring system should continuously operate for a long period in order to sense the abnormal state, and how to secure an operation power supply is an issue.

Therefore, it is efficient to secure the operation power supply according to the energy harvesting technology which utilizes a natural energy source. Depending on a position where a monitored target is located, a situation where power feed from a commercial system is difficult is also expected, and application of the energy harvesting technology is viable also in such a case.

Figure 9:
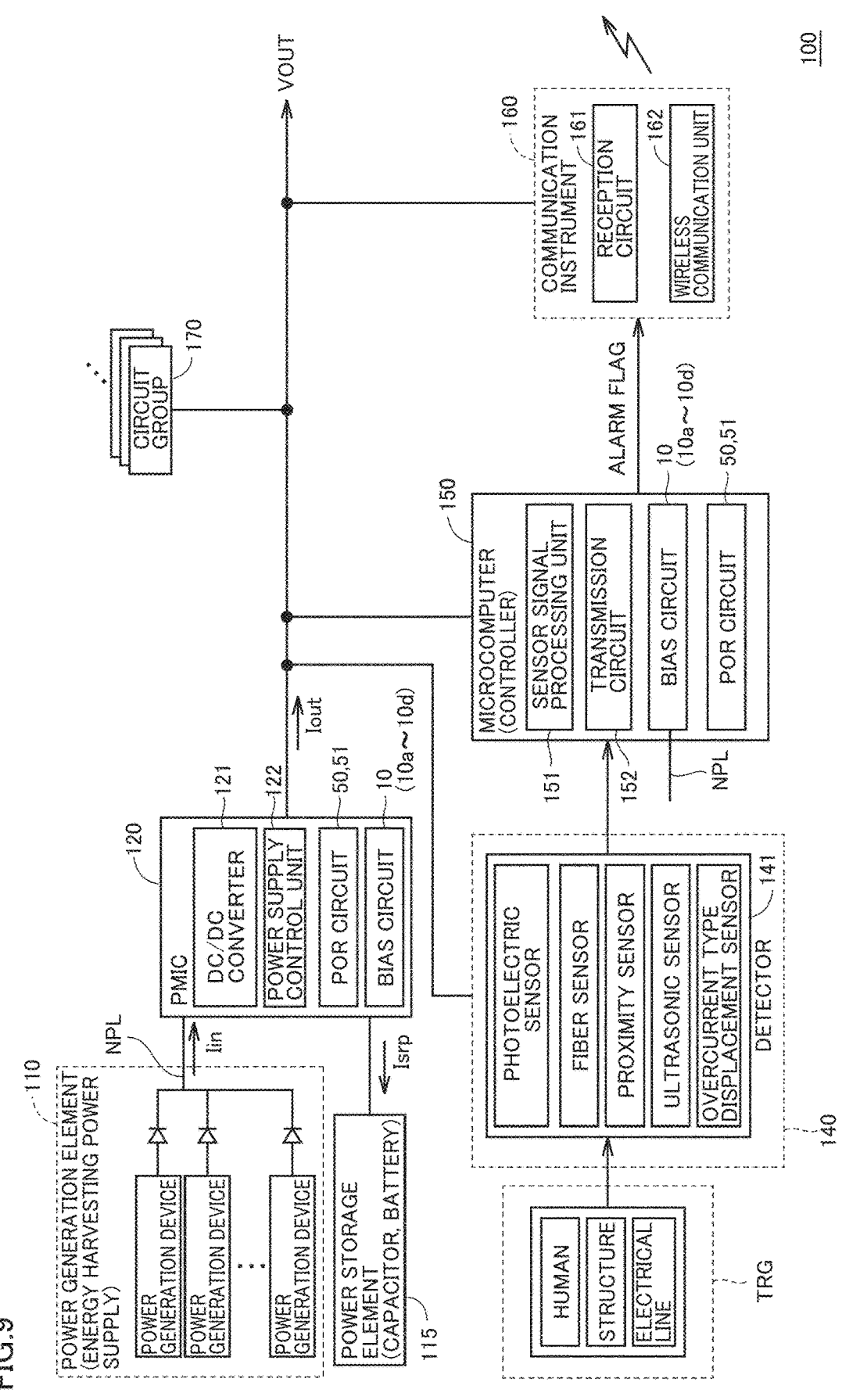
FIG. 9 is a block diagram illustrating an exemplary configuration of a monitoring system according to a third embodiment.

FIG. 9 is a block diagram illustrating an exemplary configuration of a monitoring system according to the third embodiment.

Referring to FIG. 9, a monitoring system 100 includes a power generation element 110 and a power management circuit 120. Power management circuit 120 can be implemented, for example, by a power management integrated circuit (PMIC). Power management circuit 120 includes a power converter (DC-DC converter) 121 to convert electric power from power generation element 110 and a power supply control unit 122. Power converter 121 converts a voltage of a power supply line NPL resulting from electric power from power generation element 110 into a supply voltage (output voltage VOUT) of an internal circuit to implement monitoring system 100. The internal circuit includes a detector 140 provided for a monitored target TRG represented by a human, a structure, an electrical line, and the like, a microcomputer (which is simply referred to as a "microcomputer" below) 150, a communication instrument 160, and another circuit group 170. Power supply control unit 122 controls stabilization of power converter 121 and manages electric power with the use of a power storage element 115.

Detector 140 includes a sensor group 141 to detect a state of monitored target TRG. Sensor group 141 can be composed of a photoelectric sensor and a fiber sensor to sense light and/or a proximity sensor, an ultrasonic sensor, an overcurrent type displacement sensor, or the like to detect a position of an object.

Microcomputer 150 functions as a controller of monitoring system 100 and receives a detection signal from sensor group 141. Microcomputer 150 includes a sensor signal processing unit 151 and a transmission circuit 152. When sensor signal processing unit 151 senses an abnormal state of monitored target TRG based on a detection value from sensor group 141, it generates an alarm flag to give notification of occurrence of the abnormal state. Transmission circuit 152 transmits the generated alarm flag to communication instrument 160.

Microcomputer 150 is normally configured to perform a predetermined function by execution by a not-shown central processing unit (CPU), of a program stored in a memory (not shown). For example, a function of sensor signal processing unit 151 and a function to control transmission circuit 152 can be performed by execution of the program.

Microcomputer 150 can perform various functions other than generation and transmission of the alarm flag by sensor signal processing unit 151 and transmission circuit 152, and a program and a circuit group (hardware) to perform these functions are further assumed to be incorporated.

Communication instrument 160 includes a reception circuit 161 to receive the alarm flag from microcomputer 150 (transmission circuit 152) and a wireless communication unit 162. When reception circuit 161 receives the alarm flag from microcomputer 150, wireless communication unit 162 outputs through wireless communication, a signal for notification of occurrence of the abnormal state in monitored target TRG. Notification of occurrence of the abnormal state also of monitored target TRG arranged at a remote location can be provided.

A power supply system of monitoring system 100 will now further be described.

Power generation element 110 is composed, for example, of at least one power generation device. Each power generation device performs a function to convert natural energy to electric power. For example, each power generation device can be implemented by at least any one of a solar cell to convert optical energy from sunlight or indoor light to electric power, a piezoelectric device to convert vibration energy from a vehicle or the like to electric power, a thermoelectric conversion device to convert thermal energy from an engine, an air-conditioner, piping in a building, or the like to electric power, and a rectenna to convert electromagnetic energy from a radio tower or the like to electric power. Electric power generated by power generation element 110 is supplied to power supply line NPL.

Monitoring system 100 may further be provided with power storage element 115 implemented by a capacitor and/or a battery. Power supply control unit 122 controls an operation of power converter 121 to charge power storage element 115 with a surplus current Isrp (Isrp=Iin−Iout) when an output current Iout from power converter 121 is smaller than an input current Iin supplied from power generation element 110. Output current Iout corresponds to a total of current consumption in the internal circuit.

Thus, when electric power generated by power generation element 110 exceeds power consumption in monitoring system 100, surplus electric power can be accumulated in power storage element 115. When electric power generated by power generation element 110 is insufficient (that is, Iin<Iout), on the other hand, operation of monitoring system 100 can be secured by use of electric power from power storage element 115.

Power converter (DC-DC converter) 121 converts a DC voltage of power supply line NPL to output voltage VOUT corresponding to an operating supply voltage of each circuit in monitoring system 100. Power management circuit 120 includes bias circuit 10 (comprehensive denotation of bias circuits 10a to 10d) described in the first embodiment and the modifications thereof.

In power management circuit 120, a bias voltage generated by bias circuit 10 can be used as a target voltage in feedback control of output voltage VOUT or a divided voltage of the target voltage. Alternatively, the bias voltage can be used for control of a constant current source or a constant voltage source for operations of various circuits such as a differential amplification circuit.

Bias circuit 10 (10a to 10d) has power supply node NP connected to power supply line NPL, and supply voltage AVDD of bias circuit 10 is generated from an energy harvesting power supply. As described above, bias circuit 10 can promptly generate the bias voltage and maintain the bias voltage constant in a stable manner even with respect to supply voltage AVDD which originates from the energy harvesting power supply and abruptly rises.

Therefore, since output voltage VOUT from power converter 121 can be stabilized also in monitoring system 100 which uses electric power generated by the energy harvesting power supply, monitoring system 100 can keep operating in a stable manner.

Bias circuit 10 having power supply node NP connected to power supply line NPL may be arranged also in microcomputer 150. Thus, in each circuit in microcomputer 150, the bias voltage promptly generated by bias circuit 10 at the time of rise of supply voltage AVDD owing to the energy harvesting power supply and maintained in a stable manner can be used, and hence the circuit operation is stabilized.

In addition to bias circuit 10, power on reset circuits 50 and 51 described in the second embodiment and the modification thereof can also further be arranged. As described above, since power on reset circuits 50 and 51 operate with output from bias circuit 10 according to the first embodiment and the modifications thereof, they can reliably generate the power on reset signal also for supply voltage AVDD which steeply rises. Therefore, at the time of rise of supply voltage AVDD as power generation is started from a state where power generation by power generation element 110 remains stopped, an operation to reset the circuit can reliably be performed in the circuit in monitoring system 100.

Thus, the monitoring system according to the third embodiment can perform an internal circuit operation with the bias voltage generated by bias circuit 10 (10a to 10d) and/or the power on reset signal generated by power on reset circuits 50 and 51, so as to operate in a stable manner also with supply voltage AVDD from the energy harvesting power supply. In other words, adaptability to the energy harvesting technology can be improved by introduction of bias circuit 10.

Thus, with decrease in amount of use of electric power in power storage element 115 such as a battery, monitoring system 100 can continue to operate for a long time period by combination of power generation element 110 and power storage element 115. In particular, depending on a location where monitored target TRG is provided, a case where a capacity of a battery that can be provided or a frequency of replacement of the battery may be restricted is assumed. Even in such a case, monitoring system 100 can keep operating for a long period by application of the energy harvesting technology.

Figure 10:
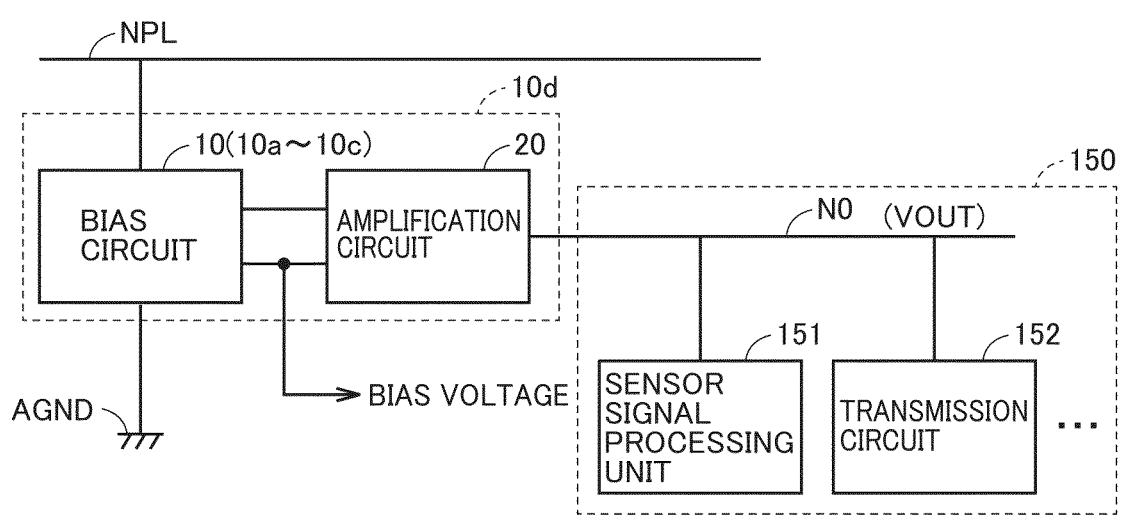
FIG. 10 is a block diagram illustrating an exemplary configuration of a power supply system of a microcomputer according to a modification of the third embodiment.

In the configuration in FIG. 9, a power supply system of microcomputer 150 may be modified as shown in FIG. 10 in order to start operations early at the time of rise of supply voltage AVDD.

FIG. 10 is a block diagram illustrating an exemplary configuration of the power supply system of the microcomputer according to a modification of the third embodiment.

Referring to FIG. 10, microcomputer 150 is supplied with an operating supply voltage from bias circuit 10d according to the third modification of the first embodiment.

As described with reference to FIG. 5, bias circuit 10*d* is configured by connection of amplification circuit 20 composed of current supply unit 14, differential amplification unit 15, and control unit 16 (FIG. 4) to a stage subsequent to bias circuits 10*a* to 10*c* according to the first embodiment and the modifications thereof.

Amplification circuit 20 generates at node NO, output voltage VOUT with low impedance which is obtained by amplification of the bias voltage outputted from bias circuits 10*a* to 10*c*. In FIG. 10, the supply voltage in microcomputer 150 such as sensor signal processing unit 151, transmission circuit 152, or the like is supplied based on the output voltage (output node NO) from bias circuit 10*d*, rather than the output voltage from power converter (DC-DC converter) 121 in FIG. 9.

Thus, in particular at the time of rise of supply voltage AVDD, that is, at the time of start of power generation by power generation element 110, early start-up of microcomputer 150 can be expected.

In connection with the plurality of embodiments and the modifications thereof described above, for confirmation purpose, combination as appropriate of features described in the plurality of embodiments described above including combination not mentioned in the specification is also originally intended within the scope where there is no inconsistency or contradiction.

It should be understood that the embodiments disclosed herein are illustrative and non-restrictive in every respect. The scope of the present disclosure is defined by the terms of the claims rather than the description above and is intended to include any modifications within the scope and meaning equivalent to the terms of the claims.

REFERENCE SIGNS LIST 5 voltage generator; 10, 10*a* to 10*d* bias circuit; 10X, 11 bias circuit unit; 12*a*, 12*b* series circuit; 12*c* output stage; 14 current supply unit; 15 differential amplification unit; 16 control unit; 17 signal generator; 20 amplification circuit; 50, 51, 52 power on reset circuit; 100 monitoring system; 101, 102 reference; 110 power generation element; 115 power storage element; 120 power management circuit; 121 power converter (DC-DC converter); 122 power supply control unit; 140 detector; 141 sensor group; 150 microcomputer; 151 sensor signal processing unit; 152 transmission circuit; 160 communication instrument; 161 reception circuit; 162 wireless communication unit; 170 circuit group; AGND ground voltage; AVDD supply voltage; CC0 phase compensation capacitor; IREF1, IREF2, IREF3 bias current; N0 output node; NG ground node; NP power supply node; NPL power supply line; R0 to R4 resistive device; TRG monitored target; VOUT output voltage (amplification circuit); VPOR1, VPOR2 power on reset signal.

The invention claimed is:

1. A bias circuit comprising:
at least one bias circuit unit, wherein
the bias circuit unit comprises
    a first resistive device connected between a power supply node to supply a supply voltage and a first node,
    a first N-type transistor diode-connected between the first node and a ground,
    a second N-type transistor having a drain connected to the power supply node, a source connected to a second node to output a bias voltage, and a gate connected to the first node,
    a second resistive device connected between the second node and a third node, and
    a third N-type transistor connected between the third node and the ground to implement a current source.

2. The bias circuit according to claim 1, comprising the bias circuit units in a plurality of stages, wherein
in the bias circuit unit in a second stage or a subsequent stage, with the second node of the bias circuit unit in a previous stage being defined as the power supply node, the first resistive device and the drain of the second N-type transistor are connected to each other.

3. The bias circuit according to claim 2, wherein
the bias circuit units in two stages are provided, and
in the bias circuit unit in the second stage, with the second node of the bias circuit unit in a first stage being defined as the power supply node, the first resistive device and the drain of the second N-type transistor are connected to each other.

4. The bias circuit according to claim 3, further comprising an amplification circuit to amplify the bias voltage outputted by the bias circuit unit in the second stage to the second node for output to an output node, wherein
the amplification circuit comprises
    a differential amplifier to amplify a voltage difference between the bias voltage and a voltage at the output node,
    current supply circuitry to supply to the differential amplifier and the output node, a current in proportion to a bias current that flows through the second node of the bias circuit unit in the second stage, and
    control circuitry to control an amount of current that flows from the output node to the ground in accordance with an output voltage from the differential amplifier.

5. The bias circuit according to claim 4, wherein
the control circuitry comprises
    a sixth N-type transistor having a drain connected to the output node, a source connected to the ground, and a gate to receive the output voltage from the differential amplifier, and
    a capacitor connected between the output node and the gate of the sixth N-type transistor.

6. A power on reset circuit comprising:
the bias circuit according to claim 2; and
a signal generator to vary a logical level of a control signal in transition from a state where the supply voltage is lower than a predetermined voltage to a state where the supply voltage is higher than the predetermined voltage, wherein
the signal generator is configured to set the logical level of the control signal in accordance with an amount of voltage lowering caused in a resistive device by a current in proportion to a bias current that flows through the second node in a bias circuit unit in a last stage.

7. The bias circuit according to claim 1, further comprising:
a first series circuit to copy a current that flows through the first node;
a second series circuit to copy a current that flows through the second node; and
an output stage to output a constant voltage as the bias voltage, wherein
the first series circuit comprises
    a first P-type transistor, and a fourth N-type transistor to implement a current mirror with the first N-type transistor, the first P-type transistor and the fourth N-type transistor being connected in series between the power supply node and the ground, the second series circuit comprises a third resistive device being equivalent in electrical resistance value to the second resistive device, and a fifth N-type transistor to implement a current mirror with the third N-type transistor, the third resistive device and the fifth N-type transistor being connected in series between the power supply node and the ground, and the output stage comprises a second P-type transistor connected between the power supply node and an output node of the constant voltage to implement a current mirror with the first P-type transistor, a third P-type transistor having a drain connected to the ground and having a gate connected to the third node, and a fourth resistive device connected between the output node and a source of the third P-type transistor and being equivalent in electrical resistance value to the first resistive device.

8. The bias circuit according to claim 1, further comprising an amplification circuit to amplify the bias voltage outputted by the bias circuit unit to the second node for output to an output node, wherein the amplification circuit operates by being supplied with a current in proportion to a bias current that flows through the second node of the bias circuit unit.

9. A monitoring system comprising:

the bias circuit according to claim 5; and a power converter to convert a voltage supplied to a power supply line to an operating supply voltage of an internal circuit of the monitoring system, wherein the internal circuit comprises a detector provided in a monitored target, a controller to perform signal processing for generating a notification flag about an abnormal state of the monitored target when the controller senses the abnormal state based on an output signal from the detector, and a communication instrument to output the notification flag from the monitoring system when the controller generates the notification flag, the power supply node of the bias circuit is connected to the power supply line, at least some of electric power supplied to the power supply line is electric power generated by an energy harvesting power supply, and the controller operates by receiving supply of power from the output node of the bias circuit.

10. The bias circuit according to claim 1, wherein the second N-type transistor is implemented by a native transistor.

11. A power on reset circuit comprising:

the bias circuit according to claim 1; and a signal generator to vary a logical level of a control signal in transition from a state where the supply voltage is lower than a predetermined voltage to a state where the supply voltage is higher than the predetermined voltage, wherein the signal generator is configured to set the logical level of the control signal in accordance with an amount of voltage lowering caused in a resistive device by a current in proportion to a bias current that flows through the second node in the bias circuit.

12. The power on reset circuit according to claim 11, wherein the signal generator comprises a fourth P-type transistor connected between the power supply node and a fourth node, a seventh N-type transistor connected between the fourth node and the ground, the seventh N-type transistor implementing a current mirror with the third N-type transistor in the bias circuit, and a fifth P-type transistor connected between the power supply node and a fifth node where the control signal is generated, the fifth P-type transistor implementing a current mirror with the fourth P-type transistor, and the fifth node is connected to the ground with the resistive device being interposed.

13. The power on reset circuit according to claim 11, wherein the second N-type transistor in the bias circuit is implemented by a native transistor.

14. A monitoring system comprising:

the power on reset circuit according to claim 9; and a power converter to convert a voltage supplied to a power supply line to an operating supply voltage of an internal circuit of the monitoring system, wherein the internal circuit comprises a detector provided in a monitored target, a controller to perform signal processing for generating a notification flag about an abnormal state of the monitored target when the controller senses the abnormal state based on an output signal from the detector, and a communication instrument to output the notification flag from the monitoring system when the controller generates the notification flag, the power supply node of the power on reset circuit is connected to the power supply line, at least a part of the internal circuit is configured to perform a reset operation in response to transition of a logical level of the control signal generated by the power on reset circuit, and at least some of electric power supplied to the power supply line is electric power generated by an energy harvesting power supply.

15. A monitoring system comprising:

the bias circuit according to claim 1; and a power converter to convert a voltage supplied to a power supply line to an operating supply voltage of an internal circuit of the monitoring system, wherein the internal circuit comprises a detector provided in a monitored target, a controller to perform signal processing for generating a notification flag about an abnormal state of the monitored target when the controller senses the abnormal state based on an output signal from the detector, and a communication instrument to output the notification flag from the monitoring system when the controller generates the notification flag, the power supply node of the bias circuit is connected to the power supply line, at least a part of the internal circuit operates with the bias voltage generated by the bias circuit, and at least some of electric power supplied to the power supply line is electric power generated by an energy harvesting power supply.

* * * * *